United States Patent [19]

Urba

[11] 4,367,523
[45] Jan. 4, 1983

[54] RECTIFIER BRIDGE UNIT

[75] Inventor: Richard J. Urba, Wayne, N.J.

[73] Assignee: Electronic Devices, Inc., Yonkers, N.Y.

[21] Appl. No.: 234,744

[22] Filed: Feb. 17, 1981

[51] Int. Cl.³ ............................................. H05K 7/20
[52] U.S. Cl. ..................................... 363/141; 363/144; 357/81; 361/387
[58] Field of Search ............................... 361/386, 387; 174/52 PE, 16 HS; 357/76, 77, 81; 363/141, 144

[56] References Cited

U.S. PATENT DOCUMENTS

| | | | |
|---|---|---|---|
| 3,157,828 | 11/1964 | Flaherty | 361/386 |
| 3,229,188 | 1/1966 | Schuler | 363/126 |
| 3,307,077 | 2/1967 | Bernstein | 361/380 |
| 3,452,267 | 6/1969 | Schuler | 363/144 |
| 3,825,767 | 7/1974 | Shields | 174/16 HS |
| 3,846,824 | 11/1974 | Bell | 361/386 |
| 3,911,327 | 10/1975 | Murari | 361/386 |
| 4,230,901 | 10/1980 | Wengler | 174/52 PE |

Primary Examiner—G. P. Tolin
Attorney, Agent, or Firm—Michael Ebert

[57] ABSTRACT

A highly compact rectifier unit constituted by a sub-assembly potted within an insulating case having a metal base plate of high thermal conductivity to provide a heat sink for dissipating heat generated by the sub-assembly to enhance the current rating and to reduce the thermal impedance of the unit. The inner face of the base plate is porcelainized to form a thin insulating film thereon electrically isolating the sub-assembly from the plate. The surface of the insulating film is metallized to define separated metallic zones thereon which make contact with correspondingly-positioned conductive base straps of the sub-assembly to create a thermal bridge between the sub-assembly and the base plate.

14 Claims, 6 Drawing Figures

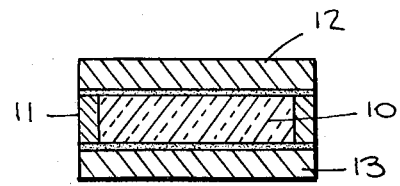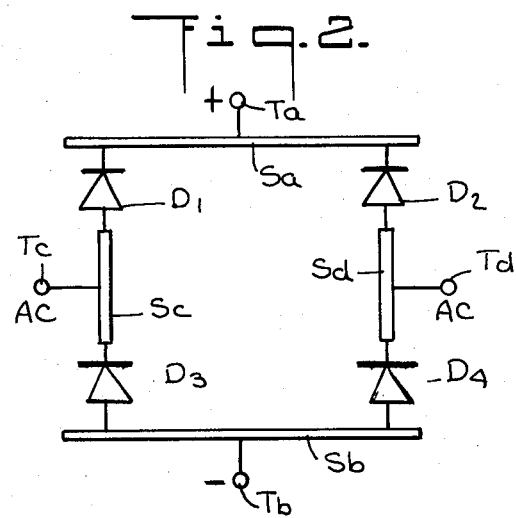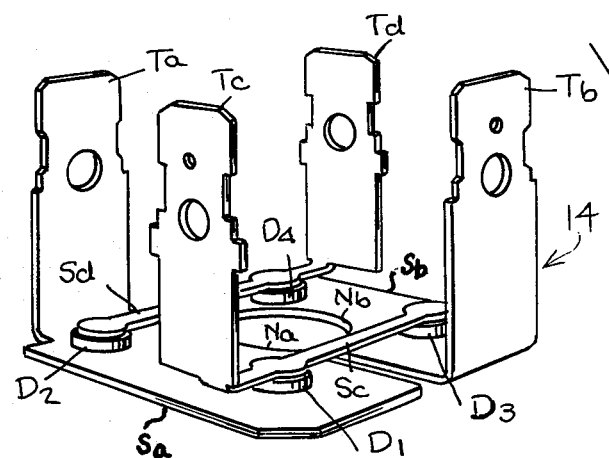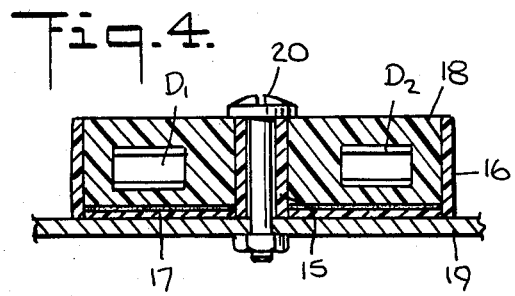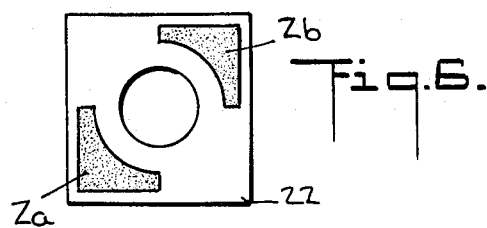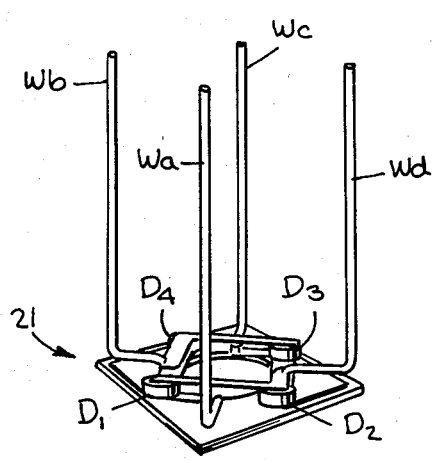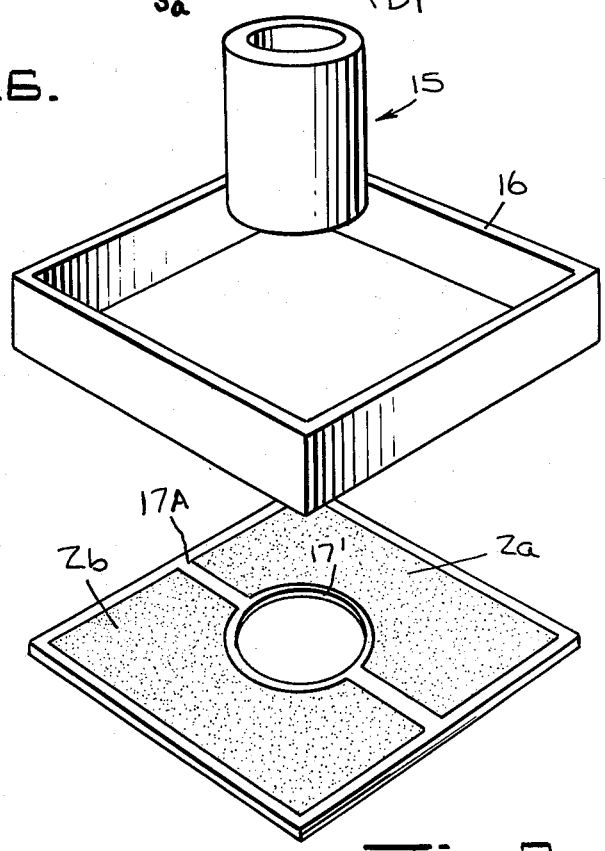

RECTIFIER BRIDGE UNIT

BACKGROUND OF INVENTION

This invention relates generally to unified devices for rectifying alternating current, and more particularly to a highly compact rectifier unit which incorporates a heat sink and has a significantly higher current rating and a lower thermal impedance than similar rectifier units.

A conventional silicon rectifying diode includes a single pn junction, the diode characteristic being such that current can freely flow in only one direction, flow in the opposite direction being blocked by the junction. The ratings of silicon diodes include voltage, current and junction temperature values. Proper circuit design must ensure that the average junction temperature will never exceed its design limit; but good design practice, which takes into account the reliability factor, limits the maximum junction temperature to a lower value. Silicon rectifier ratings are normally specified at a given case temperature and operating frequency.

An avalanche diode differs from a conventional silicon diode in its ability to absorb large reverse energy pulses of a joule or more. This capability results from the fact that avalanche breakdown is a bulk crystal phenomenon, whereas edge breakdown of a conventional diode occurs because of defects in the crystal lattice. While there are differences in reverse characteristics, the ratings of current, forward voltage drop, reverse blocking voltage and operating temperatures for an avalanche diode are similar to those of a conventional diode of the same wafer junction size.

The concern of the present invention is with rectifier units constituted by a set of silicon diodes, preferably of the avalanche type, connected in a classic rectifier circuit arrangement. It is known to house a rectifier circuit of this type in a small case, the diodes and the strap interconnections therebetween forming a sub-assembly which is encapsulated in the case by a suitable potting compound that serves to protect the diodes from contamination and adverse environmental factors such as humidity. Only the rectifier circuit input and output terminals project from the case.

A compact rectifier unit of this known type serves to replace larger stud assemblies and offers an appreciable cost and size reduction for power supplies, converters, inverters, motor controls, DC motor starters and in other applications requiring rectification.

In operation, a rectifier generates a considerable amount of heat, particularly under heavy load conditions. Unless this heat is quickly dissipated, the rectifier will be incapable of carrying a large amount of current without doing damage to its diodes. Because the epoxy potting compound usually used in an encapsulated rectifier circuit is a relatively poor heat conductor, and the diodes are in close proximity to each other within a confined case, these conditions impose distinct limits on the safe current ratings of such units.

Though the invention will be described in conjunction with a single-phase full-wave bridge rectifier, it is applicable to a family of rectifier circuits, such as single-phase doublers employing a pair of diodes in series, three-phase half-wave rectifiers making use of three diodes and three phase full-wave rectifiers constituted by six diodes, as well as various forms of hybrid rectifier circuits which include thyristors in combination with diodes, all of which arrangements make use of conductive straps to effect the necessary interconnections of the rectifier circuit.

In rectifier circuit design, one must give careful consideraation to the dissipation of heat. Semiconductor devices with power ratings greater than one watt are usually provided by the manufacturer with a large flat surface which is intended to be clamped against a metal heat exchanger. The purpose of the heat exchanger is to transfer heat generated in the semiconductor device to the sink and then to the ultimate cooling medium, usually the surrounding air, without allowing the internal temperature to exceed the manufacturer's maximum specified temperature limits. Although the term "sink" in its most accurate sense refers to the ultimate cooling medium, in engineering terminology, it is loosely used to mean the heat exchanger.

When power is dissipated in a diode junction, heat must be conducted from the junction through intervening layers of material to the heat sink, which layers are said to possess thermal impedance.

The flow of heat through a thermal impedance gives rise to a temperature difference which is proportional to the rate of heat flow. Thermal impedance obeys, as it were, a thermal ohms law, thermal impedance being euivalent to electrical impedance, the temperature being comparable to voltage and the power being comparable to current. Thermal impedance is equal to $\theta_{JC}$ where $\theta$ is degrees C per watt, J is the junction temperature, and C is the case temperature. Obviously, the lower the thermal impedance, the greater the heat dissipation.

The value of thermal impedance is a function of the thermal design of the device itself. The thermal conductivity and dimensions of the various parts of the assembly and of the solders which bond the parts together determine how much heat can be transferred from the junction to the case mounting surface while maintaining the junction temperature within the permissible maximum limit. Although a user of a rectifier device has no control over this parameter, to properly apply the device he must know its value.

The problem of heat dissipation in encapsulated or integrated circuit components has been addressed in several prior patents. Thus the Murari et al. U.S. Pat. No. 3,911,327 discloses an integrated circuit chip potted within a casing having a thermal mass embedded in the package to act as a heat sink therefor. The Flaherty U.S. Pat. No. 3,157,828 shows an encapsulated printed circuit with heat transfer means including a heat sink. The use of heat sinks in conjunction with rectifiers is also shown in the Zellmer U.S. Pat. No. 3,668,477 and the Schuler U.S. Pat. No. 3,229,188.

But where the heat-generating device is in the form of a circuit package whose casing is adapted to accommodate the rectifiers and connectors, as in the Bernstein U.S. Pat. No. 3,307,077, it has not heretofore been known to incorporate a heat sink therein. Because of space limitations, one cannot embed a heat sink in the potting compound. Moreover, even if this were possible, it would be necessary to have the heat sink in some way exposed to the atmosphere for proper heat dissipation, and this cannot be done with an embedded heat sink.

On the other hand, should the base of the case be made in the form of a metal plate functioning as a heat sink, it would be necessary to electrically isolate the base plate from the rectifier sub-assembly, and this insulation would ordinarily function as a thermal barrier between the sub-assembly and the heat sink so that the thermal impedance would inevitably be high.

SUMMARY OF INVENTION

In view of the foregoing, the main object of this invention is to provide a highly-compact rectifier unit having a rectifier circuit sub-assembly that is potted within a small case, the case incorporating a base plate in heat transfer relation to the sub-assembly that functions as a heat sink to quickly and efficiently dissipate heat generated by the sub-assembly, the unit having a much lower thermal impedance than a comparable unit lacking the heat sink feature.

A significant aspect of the invention is that it has the current-carrying capacity of a much larger unit, yet retains the reduced cost and size advantages of a small unit.

More particularly, it is an object of this invention to provide a unit of the above type which includes a rectifier circuit sub-assembly having connector base straps, and in which the base plate of the case has a porcelainized inner face to create a thin insulation film between the sub-assembly and the plate, a thermal bridge being defined between the base plate and the base straps of the sub-assembly, whereby the sub-assembly, though electrically isolated from the heat sink, is in good heat transfer relation therewith.

Also an object of the invention is to provide a miniature unit of the above type which can be mass-produced at relatively low cost, and which operates efficiently and reliably even under heavy load conditions.

Briefly stated, these objects are attained in a unit in accordance with the invention, wherein a sub-assembly constituted by diodes and other rectifying elements interconnected by means including co-planar conductive base straps is potted within an insulating case having a metal base of high thermal conductivity to function as a heat sink.

The inner face of the base plate is porcelainized to form a thin insulating film thereon for electrically isolating the sub-assembly from the base plate. The surface of the insulating film is metallized to define separated metallic zones thereon which make contact with the correspondingly-positioned base straps of the sub-assembly to create a thermal bridge between the sub-assembly and the base plate serving to quickly dissipate the heat generated in the sub-assembly, particularly when the unit is mounted on a metal chassis with the base plate in intimate contact therewith.

OUTLINE OF DRAWINGS

For a better understanding of the invention as well as other objects and further features thereof, reference is made to the following detailed description to be read in conjunction with the accompanying drawings, wherein:

FIG. 1 is a section taken through a typical silicon diode;

FIG. 2 is a schematic diagram of a single-phase, full-wave rectifier bridge;

FIG. 3 is an exploded view of one preferred embodiment of a unit in accordance with the invention which includes a bridge sub-assembly potted within a case;

FIG. 4 is a section taken through a unit of the type shown in FIG. 1 mounted on a chassis;

FIG. 5 is a perspective view of the bridge sub-assembly of another preferred embodiment of a unit in accordance with the invention; and FIG. 6 is a plan view of the heat sink base plate associated with the sub-assembly shown in FIG. 5.

DESCRIPTION OF INVENTION

The Bridge

While the invention, as previously noted, is applicable to a large family of rectifier circuits using diodes or diodes in combination with thyistors, by way of example, the invention will be described in the context of a single-phase full-wave diode bridge rectifier.

Referring first to FIG. 1, there is illustrated a standard silicon diode of the conventional or avalanche type usable in a bridge rectifier unit in accordance with the invention. The diode is composed of a round silicon chip 10 whose periphery has formed thereon a cell-passivation silicone layer 11. In practice glass passivation may be used. Bonded to the upper and lower faces of the chip are respective anode and cathode terminals 12 and 13 in the form of silver-clad aluminum discs. In the bridge in accordance with the invention, these discs are soldered to connecting straps.

Referring now to FIG. 2, there is schematically shown the elements of a single-phase, full-wave rectifier composed of four like diodes interconnected in a bridge arrangement having input diagonals to which the a-c to be rectified is applied, and output diagonals from which the d-c is derived. In FIG. 2, the diodes, connectors and terminals of the bridge have been arranged in a manner corresponding to the bridge sub-assembly included in a unit in accordance with the invention.

The bridge is formed by four like diodes $D_1$ to $D_4$, base connector straps $S_a$ and $S_b$, upper connector straps $S_c$ and $S_d$ and terminals $T_a$ to $T_d$. Diodes $D_1$ and $D_2$ have their cathode terminals soldered to the ends of base strap $S_a$ whereby these diodes are connected in series opposition, while diodes $D_3$ and $D_4$ have their anode terminals soldered to the ends of base strap $S_b$ so that these diodes are also connected in series opposition in a direction opposed to the first pair.

The anode of diode $D_1$ is connected by upper strap $S_c$ to the cathode of diode $D_3$ so that these diodes are in series, diodes $D_2$ and $D_4$ being likewise interconnected by upper strap $S_d$. Output terminals $T_a$ and $T_b$ of the bridge are connected to straps $S_a$ and $S_b$ respectively, and input terminals $T_c$ and $T_d$ are connected to straps $S_c$ and $S_d$ respectively. In a sub-assembly in accordance with the invention, the straps serve not only as circuit connectors but also as structural beams to create a square shaped sub-assembly. In practice, the sub-assembly may be in other structural forms, such as round or oval.

The First Embodiment

Referring now to FIG. 3 showing the components of a rectifier unit in accordance with the invention, the main component is a sub-assembly, generally designated by numeral 14, whose elements are the same as those in the full-wave bridge shown schematically in FIG. 2.

It will be seen that base straps $S_a$ and $S_b$ are arranged in parallel in a common plane, diodes $D_1$ and $D_2$ being soldered to the ends of strap $S_2$, and that diodes $D_3$ and $D_4$ are soldered to the ends of strap $S_b$. Terminals $T_a$ and $T_b$ are extensions of the respective base straps $S_a$ and $S_b$ and are integral therewith, these terminals being bent to assume upright positions. The upper strap $S_c$ which bridges the upper ends of diodes $D_1$ and $D_3$ has an upright terminal $T_c$ integral therewith. The upper strap $S_d$, which is parallel to strap $S_c$ and in the same plane, bridges the upper ends of diodes $D_2$ and $D_4$, terminal $T_d$ being integral therewith. Upper straps $S_c$ and $S_d$ are at right angles to the base straps $S_a$ and $S_b$ so that the combination of diodes and straps from a square frame of good structural strength.

The co-planar base straps $S_a$ and $S_b$ which are formed of a metal of good electrical and thermal conductivity, such as silver-plated copper, function as heat conductors for the diodes soldered thereto and may be stamped out of sheet material. These base straps have complementary arcuate notches $N_a$ and $N_b$ cut therein to define a circle to accommodate an insulating sleeve 15 or mounting post. This post is fabricated of "VALOX" made by General Electric or other suitable synthetic plastic material of good insulating quality capable of withstanding the operating temperatures of the unit.

Sub-assembly 14 is nested within a square insulating frame 16 formed of the same or similar material as sleeve 15. Frame 16 in combination with a metal base plate of high thermal conductivity, such as carbon steel or aluminum, form a case for the sub-assembly, the base plate having a center bore 17' to socket the lower end of sleeve 15. The height of the sleeve matches that of the square frame.

The inner face 17A of the base plate is porcelainized to create a thin insulating film or layer thereon. In practice, the porcelain film has a thickness in the order of 0.005 to 0.008 inches. This thickness represents a compromise between ideal dielectric requirements and thermal impedance; for it is important that the film not interpose a thermal barrier between the base straps of the sub-assembly and the metal base plate which acts as a heat sink.

The porcelain film is obtained by high temperature heating and sintering a mixture of kaolin, feldspar and quartz to the inner face of the metal plate to produce a semi-opaque, dense and waterproof film thereon fused to the metal plate. The procedure for producing the film may be that presently used in porcelainizing laboratory utensils or for fusing a vitreous layer onto a metal plate. In practice, the base plate may be provided with small lugs (not shown) receivable in corresponding notches in the lower edges of the frame to hold the base plate thereon to form the case.

Formed by a silk-screen or other suitable metal printing or metal deposition technique on the surface of porcelain film 17A are two like metallic zones $Z_a$ and $Z_b$ symmetrically disposed with respect to center hole 17'. The profile of the zones is similar to that of base straps $S_a$ and $S_b$ of the sub-assembly. The metallic zones may be fabricated of silver or copper.

Thus the sub-assembly, when resting on the base plate has its base straps $S_a$ and $S_b$ superposed on metallic zones $Z_a$ and $Z_b$, the base straps being soldered thereto so that the straps are in intimate physical engagement with the zones for effective heat transfer thereto. The base straps joined to the metallic zones are separated from the heat sink base plate 17 only by a very thin film of porcelain. The broad area of these straps lies parallel and in close proximity to the inner surface of the base plate, thereby creating a thermal bridge between the sub-assembly and the base plate to quickly dissipate heat generated in the assembly. The sub-assembly is encapsulated in the case by a potting compound 18, such as an epoxy composition having good electrical insulating properties.

The rectifier unit may be directly bolted to a chassis 19 by a bolt 20, as shown in FIG. 4, which passes through sleeve 15, whereby the metal outer face of base plate 17 is in direct contact with the metal surface of the chassis. In this way, the heat generated in the rectifier unit is picked up by the base plate 17 acting as a heat sink and quickly transferred to the chassis, whereby the temperature of the unit is maintained within safe limits, even under heavy operating loads. Because of this arrangement, a unit in accordance with the invention has a current rating that is significantly higher than similar units which lack a porcelainized heat sink.

The thermal impedance of a unit in accordance with the invention is much lower than a substantially identical unit lacking the heat sink feature. Thus a 25 ampere, single phase full-wave bridges manufactured by Electronic Devices, Inc. of Yonkers N. Y. as Series PB and PBL have a thermal impedance $\theta$ JC rating of 2.4 typ. whereas the same device when incorporating a sink in accordance with the invention has a thermal impedance as low as 0.7.

Second Embodiment

FIG. 5 shows a rectifier brdige sub-assembly 21 in another and still smaller embodiment of the invention; while FIG. 6 separately illustrates the porcelainized base plate 22 to which this sub-assembly is soldered.

It will be seen in FIG. 5 that both the upper and lower straps associated with diodes $D_1$ and $D_4$ are relatively narrow and have wires $W_a$ and $W_d$ integral therewith to function as the bridge terminals.

The terminal wires $W_a$ and $W_d$ are bent to assume upright positions at the corners of the base plate, the square frame defined by the diodes and the interconnecting straps of the sub-assembly being oriented so that their corners lie at the midpoints of the sides of base plate 22, thereby making optimum use of the space available in the square case (not shown) within which the sub-assembly is nested and potted.

Because the base straps in this arrangement lie at a 45 degree angle with respect to the related sides of the base plate, the metallized zones $Z_a$ and $Z_b$ on the porcelain film on the base plate are similarly oriented, so that these straps can be soldered thereto to form a thermal bridge, as in the first embodiment. In all other respects, the second embodiment functions in the same manner of the first.

While there have been shown and described preferred embodiments of a rectifier unit in accordance with the invention, it will be appreciated that many changes and modifications may be made therein without, however, departing from the essential spirit thereof. Thus with small units instead of base straps for interconnecting the diodes, the interconnections may be made by soldering the diodes directly to the metallized zones on the porcelain film.

Though the open-top case of the unit has been disclosed herein as a discrete component into which one places the sub-assembly, a liquid potting compound then being poured therein to encapsulate the sub-assembly, in practice, encapsulation may be effected by a transfer molding technique, in which event there is no discrete case. In transfer molding, the sub-assembly with the metal base plate soldered thereto is placed within a mold which is then filled with a molding powder, whereby the case is then defined by the periphery of the molding compound which encapsulates the sub-assembly.

I claim:

1. A highly compact rectifier unit comprising:
(A) a sub-assembly constituted by rectifying elements interconnected in a rectifying circuit arrangement by means including planar base straps and upwardly projecting terminals; and
(B) an insulating frame formed of a material capable of withstanding the operating temperatures of the unit to accommodate the sub-assembly which is encapsulated therein by a potting compound with the terminals being adjacent the wall of the frame, said frame being provided with a metal base plate of high thermal conductivity which functions as a heat sink and in combination with the frame forms an open-top case, the inner face of the plate having a porcelain film fused thereon whose thickness is no greater than about 8 mils to define a thin dielectric electrically isolating the plate from the sub-assembly whose planar base straps rest on the film to create a thermal bridge between the sub-assembly and the base plate, said film in the zones in which said base straps rest thereon being metallized to form metallic zones electrically isolated from each other to which said base straps are soldered to hold said base straps in intimate physical and thermal contact with the film.

2. A unit as set forth in claim 1, wherein said rectifying elements are diodes in a single-phase, full-wave bridge.

3. A unit as set forth in claim 2, wherein said diodes are avalanche diodes.

4. A unit as set forth in claim 1, wherein said rectifying elements are a combination of diodes and thyristors.

5. A unit as set forth in claim 2, wherein said bridge has one pair of terminals integral with the base straps at right angles thereto, and a second pair of terminals integral with upper straps at right angles thereto to form a square sub-assembly, said terminals projecting upwardly through the potting compound.

6. A unit as set forth in claim 5, wherein said base plate has a center bore therein to socket an insulating sleeve within the case for receiving a mounting bolt, said case having a square formation.

7. A unit as set forth in claim 6, wherein the corners of the square sub-assembly lie within the corners of the square case and the terminals are positioned at points displaced from the case corners.

8. A unit as set forth in claim 6, wherein the corners of the square sub-assembly are displaced from the corners of the square case, and the terminals lie adjacent the corners of the case.

9. A unit as set forth in claim 1, wherein said porcelain film is a composition including quartz which is fused to the inner face of the metal plate.

10. A unit as set forth in claim 9, wherein said film has a thickness of about 5 to 8 mils.

11. A unit as set forth in claim 1, wherein said plate is fabricated of carbon steel.

12. A unit as set forth in claim 1, wherein said plate is fabricated of aluminum.

13. A unit as set forth in claim 1, wherein said plate is fabricated of copper.

14. A unit as set forth in claim 1, wherein said case is defined by the periphery of a molding compound encapsulating the sub-assembly.

* * * * *